(12) United States Patent
Sharma

(10) Patent No.: US 7,189,635 B2
(45) Date of Patent: Mar. 13, 2007

(54) REDUCTION OF A FEATURE DIMENSION IN A NANO-SCALE DEVICE

(75) Inventor: Shashank Sharma, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/943,559

(22) Filed: Sep. 17, 2004

(65) Prior Publication Data

US 2006/0063368 A1 Mar. 23, 2006

(51) Int. Cl.
*H01L 21/20* (2006.01)

(52) U.S. Cl. ............ 438/584; 438/770; 438/800; 438/618; 428/429

(58) Field of Classification Search ......... 438/584, 438/770, 800, 618; 428/429
See application file for complete search history.

(56) References Cited

U.S. PATENT DOCUMENTS

| | | | | |
|---|---|---|---|---|
| 5,378,654 A | * | 1/1995 | Hsue | 438/305 |
| 5,453,395 A | * | 9/1995 | Lur | 438/433 |
| 5,516,716 A | * | 5/1996 | Hawkins et al. | 438/144 |
| 5,772,905 A | * | 6/1998 | Chou | 216/44 |
| 6,156,602 A | * | 12/2000 | Shao et al. | 438/238 |
| 6,171,954 B1 | * | 1/2001 | Hsu | 438/656 |
| 6,294,450 B1 | | 9/2001 | Chen et al. | |
| 6,309,580 B1 | | 10/2001 | Chou | |
| 6,365,059 B1 | | 4/2002 | Pechenik | |
| 6,407,443 B2 | | 6/2002 | Chen et al. | |
| 6,815,278 B1 | * | 11/2004 | Ieong et al. | 438/198 |
| 6,830,962 B1 | * | 12/2004 | Guarini et al. | 438/149 |
| 6,933,187 B2 | * | 8/2005 | Jang | 438/197 |
| 6,972,259 B2 | * | 12/2005 | Wang et al. | 438/694 |
| 2004/0082178 A1 | * | 4/2004 | Kamins et al. | 438/691 |
| 2005/0112812 A1 | * | 5/2005 | Jang | 438/197 |

OTHER PUBLICATIONS

A. T. Tilke, F.C. Simmel, H. Lorenz, R.H. Blick and J. P. Kotthaus, "Quantum intererence in a one-dimensional silicon nanowire", Physical Review B, vol. 68, 075311 (2003), pp. 075311-1 to 075311-6.

A. Tilke, R.H. Blick, H. Lorenz, J.P. Kotthaus and D.A. Wharam, "Coulomb blockade in quasimetallic silicon-on-insulator nanowires", Applied Physics Letters, vol. 75, No. 23, Dec. 6, 1999, pp. 3704-3706.

K. Early, M. L. Schattenburg and Henry L. Smith, "Absence of Resolution Degradation in X-ray Lithography for [Wavelength] from 4.5 nm to 0.83 nm", Microelectronic Engineering, Nov. 1990 317-321.

Yong Chen et al., "Nanoscale Molecular-Switch Devices Fabricated by Imprint Lithography", Applied Phys. Lett., vol. 82, No. 10 (Mar. 10, 2003) pp. 1610-1612.

S. Y. Chou, P. R. Krauss, P. J. Renstrom, "Imprint Lithography with 25-Nanometer Resolution", Science, vol. 272(5258) Apr. 5, 1996, pp. 85-87.

* cited by examiner

*Primary Examiner*—Andy Huynh
*Assistant Examiner*—David Goodwin

(57) ABSTRACT

Nano-scale devices and methods provide reduced feature dimensions of features on the devices. A surface of a device substrate having a pattern of spaced apart first nanowires is consumed, such that a dimension of the first nanowires is reduced. A second nanowire is formed in a trench or gap between adjacent ones of the first nanowires, such that the nano-scale device includes a set of features that includes the first nanowires with the reduced dimension and the second nanowire spaced from the adjacent first nanowires by sub-trenches.

60 Claims, 7 Drawing Sheets

REDUCTION OF A FEATURE DIMENSION IN A NANO-SCALE DEVICE

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-3-0005 awarded by the Defense Advanced Research Projects Agency.

BACKGROUND

1. Technical Field

The invention relates to nano-scale devices and the fabrication of nano-scale devices. In particular, the invention relates to reducing a size, spacing and/or pitch dimension of features in a nano-scale device or structure.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having dimensions that are often 50 to 100 times smaller than conventional semiconductor structures. Nano-imprinting lithography is a technique used to fabricate nano-scale structures.

Nano-imprinting lithography uses a mold to imprint nano-scale structures on a substrate using a top-down scaling technique. A mold typically contains a plurality of protruding and/or recessed regions or 'features' having some nano-scale dimensions. Typically, the features of the mold are imprinted on a substrate coated with a viscous polymer precursor. Thus, the features on the mold are complementary to the desired device features (e.g., nanowires). The dimensions achieved for the features on the mold, such as nanowire width and pitch, ultimately affect the dimensions achieved for the desired device features. A mold can be fabricated using electron beam (e-beam) lithography or x-ray lithography to define a pattern and a dry etching process, typically reactive ion etching (RIE), to create features from the pattern in the mold in the nano-scale and/or micro-scale range(s). Various lithography steps are repeated in a serial manner in an attempt to achieve smaller dimensions. The current e-beam or x-ray lithographies are limited in yielding molds with a nanowire width less than about 15 nm and a nanowire pitch less than about 30 nm. In addition, the e-beam and x-ray lithographic processes are very slow processes rendering such serial repetition of steps undesirable for achieving smaller dimensions. Moreover, significant improvements in the conventional e-beam and x-ray lithographic steps are necessary to achieve a feature pitch dimension less than about 30 nm and/or a feature width or a feature spacing of less than about 15 nm. Such improvements are not cost effective since an inherent limitation in these lithographic processes restricts achieving features sizes smaller than about 15 nm. It has been reported that feature sizes of approximately 10 nm are achievable with these conventional processes. However, usually there is a trade-off between the line-width and the line-spacing (i.e., pitch) and feature quality. Thus, these dimensions are estimates of the limits on the feature size and spacing achievable conventionally.

Accordingly, it would be desirable to fabricate nano-scale devices or structures with greater nano-scale feature density at potentially lower cost than conventionally fabricated with e-beam or x-ray lithography and RIE. Such fabricated nano-scale devices would solve a long-standing need in the developing area of a "top-down" fabrication approach in nanotechnology.

BRIEF SUMMARY

In some embodiments of the present invention, a method of reducing feature dimensions of a nano-scale device is provided. The method of reducing comprises consuming a surface of a device substrate. The device has a pattern of spaced apart first nanowires on the substrate surface. The consumption reduces a dimension of the first nanowires. The method of reducing further comprises forming a second nanowire in a trench between adjacent ones of the first nanowires. As a result of forming, the device comprises a set of features that includes the first nanowires with the reduced dimension and the second nanowire spaced from the adjacent first nanowires by sub-trenches.

In other embodiments of the present invention, a method of fabricating a nano-scale device with reduced feature dimensions is provided. The method of fabricating comprises forming a plurality of spaced apart first nanowire features on a substrate. The first features are spaced apart from one another by first gaps. The method of fabricating further comprises consuming the surface of the substrate, such that the consumed surface reduces a dimension of the first features. The method of fabricating further comprises forming a second nanowire feature in a first gap between adjacent first features. As such, the device has a set of features that comprises the reduced-dimension first features and the second feature separated from the first features by second gaps that are narrower than the first gaps.

In other embodiments of the present invention, a nano-scale device with reduced feature dimensions is provided. The nano-scale device comprises first nanowires formed on a substrate. The first nanowires are spaced apart on the substrate. The nano-scale device further comprises a second nanowire added on the substrate in a gap between adjacent ones of the first nanowires. The second nanowire and the first nanowires have a similar material characteristic. The added second nanowire effectively decreases a core width of the first nanowires.

Certain embodiments of the present invention have other features in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
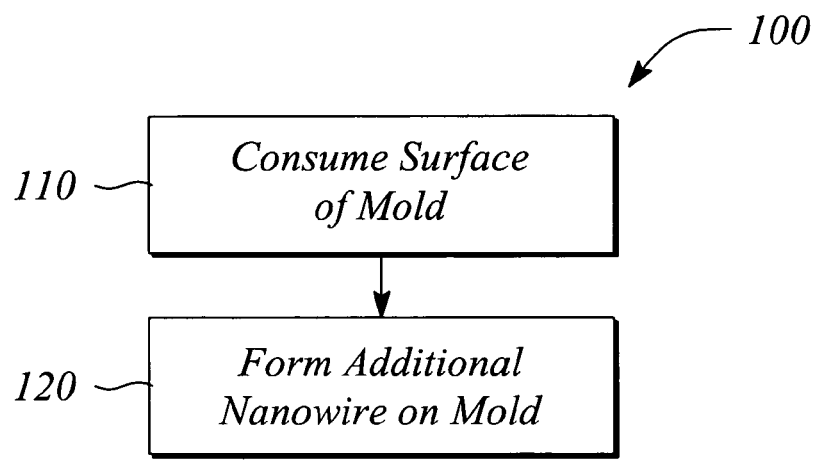
FIG. 1A illustrates a flow chart of a method of reducing feature dimensions on an imprinting mold or other device substrate according to an embodiment of the present invention.

Embodiments of the present invention are directed to fabrication of nano-scale devices or structures and nano-scale devices thus fabricated. In some embodiments, the device fabrication and the device thus fabricated are used in imprint lithography. In some embodiments, the device fabrication and the device thus fabricated are used in one or more of photonic, electronic, sensing, nanofluidic and catalysis applications, for example. In each embodiment, the fabrication and the fabricated device includes consumption of a substrate surface to form a sacrificial sheath or shell on the substrate that is later removed. When the sheath is removed, a core dimension of the substrate is reduced that translates to a reduced dimension of a feature defined on the substrate surface. As such, smaller and/or closer spaced nano-scale features can be achieved on the substrate than features achieved without the consumption. In particular, one or more of size, spacing and/or pitch of the features are reduced and a number of the features is increased as a result of the various embodiments of the present invention. Moreover, a number of the features is increased as a result of various embodiments of the present invention.

While described below with respect to imprint lithography applications, it is intended that the various embodiments of the present invention include device fabrication for devices used in other applications than imprint lithography, such as for the above-mentioned exemplary photonic, electronic, sensing, nanofluidic and catalysis device applications. Therefore, the scope of the embodiments described herein is not intended to be limited to imprinting molds and imprint lithography applications. For example, references to 'mold substrate' and 'surface' of an imprinting mold extend equally to a device substrate, a substrate or wafer, and a surface of a substrate or wafer.

In some embodiments of the present invention, a method of reducing feature dimensions of a nano-scale structure or device is provided. The method of reducing feature dimensions is described below with respect to an imprinting mold as the nano-scale device by way of example and not limitation herein. According to the method of the present invention, an amount of a surface of the imprinting mold is consumed. The mold has imprintable nanowire features formed on the surface. The consumed mold surface results in the formation of 'core-shell' or 'core-sheath' structured features until the sheath is removed. The sheath is made up of a sacrificial material used to consume the surface. The remaining core of the mold underneath the sheath includes the imprintable nanowires. Since the sheath requires consumption of the mold surface, a core dimension of the imprintable nanowires on the surface gets reduced.

In some embodiments, the method is applied to a preexisting imprinting mold that has one or both of nano-scale and micro-scale imprintable features already defined therein. In other embodiments, such imprintable features are fabricated on a substrate using known techniques including, but not limited to one or more of e-beam and/or x-ray lithography and dry etching, such as reactive ion etching (RIE) and/or anisotropic wet chemical etching. Then, the method of reducing is applied to the fabricated features according to the present invention. As such, in some embodiments of the present invention, a method of fabricating a nano-imprinting mold with reduced feature dimensions is provided.

Hereinafter, a 'preexisting' mold refers to an imprinting mold having a pattern of one or both of nano-scale and micro-scale imprintable features defined therein using conventional or known techniques for forming features on a mold or a substrate or wafer, such as one or more of e-beam lithography, x-ray lithography and anisotropic etching (e.g., RIE), or using techniques that become available to the skilled artisan for such feature formation. The preexisting imprinting mold also may be considered an off-the-shelf (OTS) imprinting mold. Moreover, an 'imprintable feature' includes a feature of the mold pattern that ultimately defines an imprinted structure after an imprinting process (i.e., using imprint lithography). As such, a nano-scale feature of the mold pattern is also referred to herein as a nanowire feature or a pair of nanowires or adjacent nanowires spaced apart or separated by a trench or gap, for example, and may include within its scope a corresponding feature that is micro-scale unless otherwise indicated.

For the purposes of the embodiments of the present invention, a 'feature dimension' of a feature on an imprinting mold includes one or more of a height dimension, a width dimension, a spacing dimension between adjacent features and a pitch dimension that is (are) reduced. For example, assume that a typical 'nano-scale' pitch dimension of adjacent features is as small as about 30 nm, for example and without limitation herein, using the conventional patterning and fabrication techniques mentioned above. In this example, a nanowire feature may be about 15 nm wide and spaced from an adjacent nanowire feature by about 15 nm or some other combination that sums to the pitch dimension of approximate 30 nm (i.e., the pitch equals the feature width plus the space between the adjacent features). According to the embodiments of the present invention, the preexisting pitch dimension is decreased or reduced about in half, for example, to at least about 15 nm, as is further described below. Moreover, various embodiments of the present invention further reduce the reduced pitch dimension incrementally, such as in half, etc., depending on how many times the methods of the present invention are repeated.

FIG. 1A illustrates a flow chart of a method 100 of reducing feature dimensions on an imprinting mold or other device substrate, according to an embodiment of the present invention. The method 100 of reducing comprises consuming 110 a surface of a preexisting imprinting mold. A consumption layer is grown and/or deposited such that the layer effectively consumes some of the mold material to form a shell. In other words, a 'core-shell' structure is formed by the consumption layer that consumes an amount of the mold material. The shell thus formed on and/or in the mold surface is essentially a 'sacrificial' shell due to its later removal, as will be further described below. In general, a material system useful for the various embodiments of the present invention includes a consumption material that will consume an amount of the mold core to form the sacrificial shell structure. Such material systems include, but are not limited to, a silicon core-silicon dioxide shell, a metal core-metal X shell, where X includes, but is not limited to, oxide, nitride, silicide, sulfide, and carbide, for example, and the metal includes, but is not limited to, titanium, tungsten, platinum, silver, and copper, for example. One skilled in the art can readily ascertain other materials and material systems that provide for consumption of a substrate core. All of these materials are within the scope of the embodiments of the present invention. The materials and material systems named here are not intended to limit the scope of the embodiments in any way.

In some embodiments, the mold material is silicon (Si) and consuming 110 a surface comprises growing a thermal oxide on the surface of the silicon mold. The thermal oxide encroaches into the silicon mold material to consume some of the silicon as silicon dioxide ($SiO_2$) to form a $SiO_2$ shell on the silicon core. Germanium (Ge) is another example of a semiconductor mold material that may be used according to various embodiments.

In other embodiments, the mold material is a metal. In these embodiments, consuming 110 a surface of the mold to form a shell on the metal core comprises growing and/or depositing a consumption material on the surface of the metal mold such that an amount of the surface is consumed. The consumption material encroaches into the metal mold surface to consume the metal as a respective shell of the metal. For example, a silicon layer is deposited on a titanium mold and annealed to thus consume 110 some of the titanium to grow and form a titanium silicide ($TiSi_2$) shell for the purposes of these embodiments. In another example, $TiSi_2$ can be deposited on the titanium mold using CVD, for example. The chemical vapor deposited $TiSi_2$ consumes 110 some of the underlying titanium of the mold to grow and form a $TiSi_2$ shell or sheath also for the purposes of these embodiments. Regardless of the embodiment, the consumption layer or sacrificial shell effectively reduces a dimension of the mold core, as further described herein. Herein, 'grown and/or deposited' and 'growing and/or depositing', and their counterparts, such as 'growing' or 'depositing', may be referred to herein generally as 'formed' and 'forming', respectively, for simplicity purposes and without limitation.

As mentioned above, the preexisting mold has a feature defined therein in the typical nano-scale feature size range defined above as achievable with e-beam and/or x-ray lithography and RIE, for example. For simplicity of discussion only, the preexisting mold will be described as having a pair of adjacent nanowire features separated by a trench formed on or in (i.e., of) a mold core or mold substrate of the mold, for example. These features of the preexisting mold may be referred to herein as 'mold core' features, which will be better understood with reference to 'added' features described below. It should be understood that the preexisting mold may have more than a pair of nanowires, including a plurality of spaced apart nanowires, wherein a nanowire is separated from adjacent nanowires by a trench, space or a gap, and still be within the scope of the various embodiments of the present invention. Moreover, in some embodiments, a preexisting imprinting mold may be considered a mold having both first nanowires, formed previously, and added second nanowires between adjacent first nanowires that were added by the method of the present invention. In these embodiments, both the first nanowires and the second nanowires will have a feature dimension reduced by repeating the method of the present invention.

The method 100 of reducing further comprises forming 120 another or an additional nanowire feature in the trench between the nanowire pair, such that the mold comprises a set of features that includes the nanowire pair and the additional nanowire spaced from the nanowire pair by sub-trenches.

Hereinafter, the method 100 of reducing feature dimensions will be described with reference to the silicon mold embodiment for simplicity of discussion only and not by way of limitation. It should be understood that the steps of the method 100 according to this embodiment are similarly applicable to other mold material embodiments, wherein terms used below related to 'oxidation', 'oxidizing' and 'oxide' are essentially interchangeable with corresponding terms related to other consumption means and materials, such as the silicide, nitride, carbide and sulfide shells, for example, as will be evident to those skilled in the art. All such consumption materials and methods and effectively interchangeable terms are within the scope of the various embodiments of the present invention.

Figure 1B:
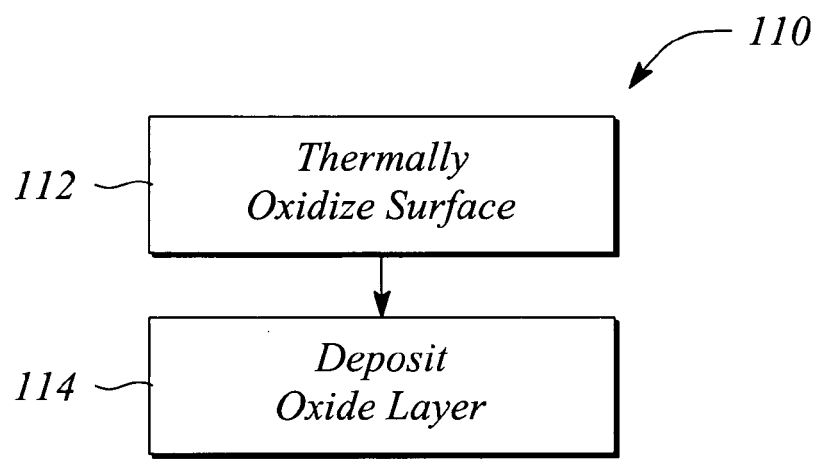
FIG. 1B illustrates a flow chart of a consumption process for an imprinting mold or other device substrate according to an embodiment of the present invention.
Figure 1C:
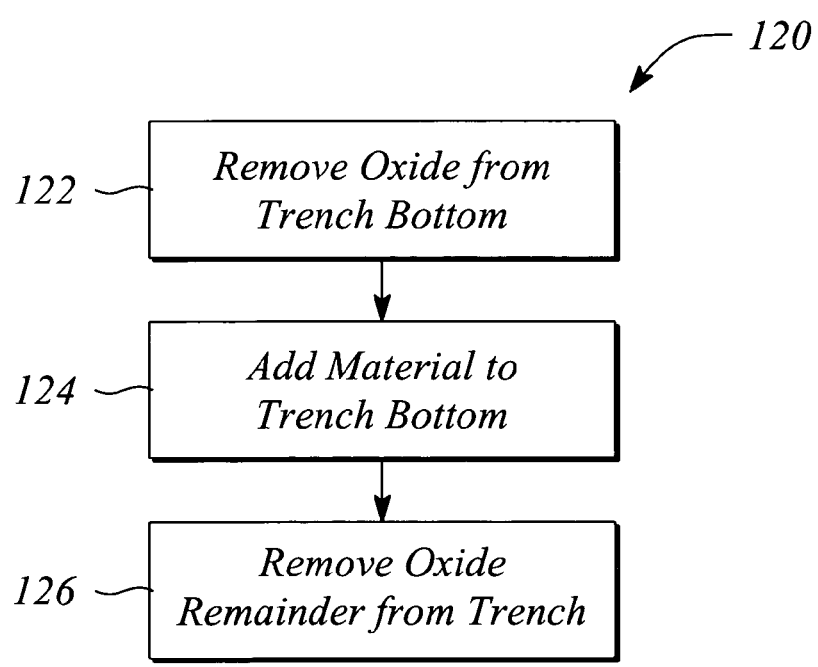
FIG. 1C illustrates a flow chart of a formation process of a nanowire feature on an imprinting mold or other device substrate according to an embodiment of the present invention.

FIGS. 1B and 1C illustrate flow charts of a consumption process 110 and a formation process 120 of the additional nanowire, respectively, according to some embodiments. FIGS. 2A–2G illustrate sequential side views of a preexisting imprinting mold 200 or other device substrate during feature size reduction according to various embodiments of the method 100 of the present invention. Hereinafter, various ones of FIGS. 2A–2G may be referenced together with any of FIGS. 1A–1C to facilitate discussion.

Referring to FIG. 1B and FIGS. 2A–2C, in some embodiments, consuming 110 comprises thermally oxidizing 112 the surface of the silicon mold core 202 such that a thermal oxide layer 212 of the silicon core both covers the surface and embeds or encroaches into the mold core 202 to an 'oxide' depth or more generally, an 'encroachment' depth. The thermal oxide layer 212 is referred to herein also as a 'first material layer 212', and is the consumption layer or the sacrificial shell or sheath, mentioned above. The thermal oxide layer 212 (i.e., a grown silicon dioxide layer 212 or consumption layer 212) has an oxide thickness $Ox_1$ and an oxide depth of the embedded portion equal to $Ox_{1d}$, for example. As such, a thickness of the mold core 202 changes from a starting mold core thickness $C_s$, to a reduced mold core thickness $C_r$ (i.e., $C_s - Ox_{1d} = C_r$) after thermal oxidation 112 of the silicon mold. An amount that a thermal oxide layer, or a consumption layer in general, will embed into a surface depends on or is controlled by the parameters of the thermal oxidation 112 or consumption 112, such as time and temperature, and the materials used, as is known or readily available to those skilled in the art, and is not considered a limitation herein. For example, a first material or consumption layer 212 of a silicide, a nitride, a carbide or a sulfide material, for example, may embed or encroach into a particular metal mold or substrate by a different amount under similar parameters during consuming 110, as is recognized by one skilled in the art.

In some embodiments, the surface of the mold core 202 is thermally oxidized 112 using known techniques. For example, a mold 200 made from a silicon wafer is thermally oxidized 112 by growing or forming a silicon dioxide layer 212 on (and in) the surface of the silicon mold 200 using heat and, in some embodiments, the introduction of oxygen in a controlled atmosphere. The embedded silicon dioxide reduces the size of the silicon core 202 of the mold 200.

Consuming 110 further comprises depositing 114 an oxide layer 214 (or a second material layer 214) on the thermal oxide layer 212 to a thickness $Ox_2$. In some embodiments, the oxide layer 214 is deposited 114 on the thermal oxide layer 212 using plasma enhanced chemical vapor deposition (PECVD), for example, of silicon dioxide at about 400° C.

Figure 2A:
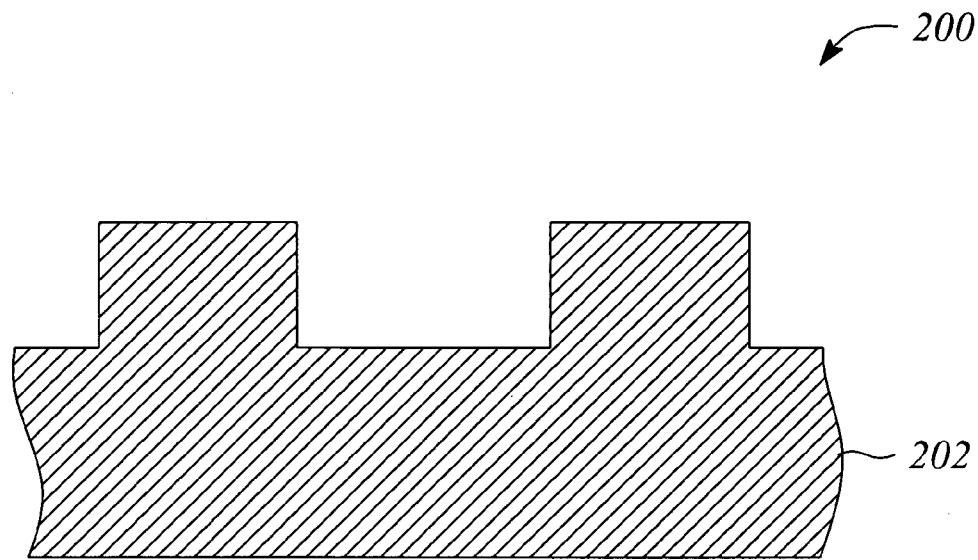
FIGS. 2A–2G illustrate sequential side views of an imprinting mold or other device substrate having dimensions of preexisting features reduced using the method illustrated in FIGS. 1A–1C in accordance with an embodiment of the present invention.
Figure 2B:
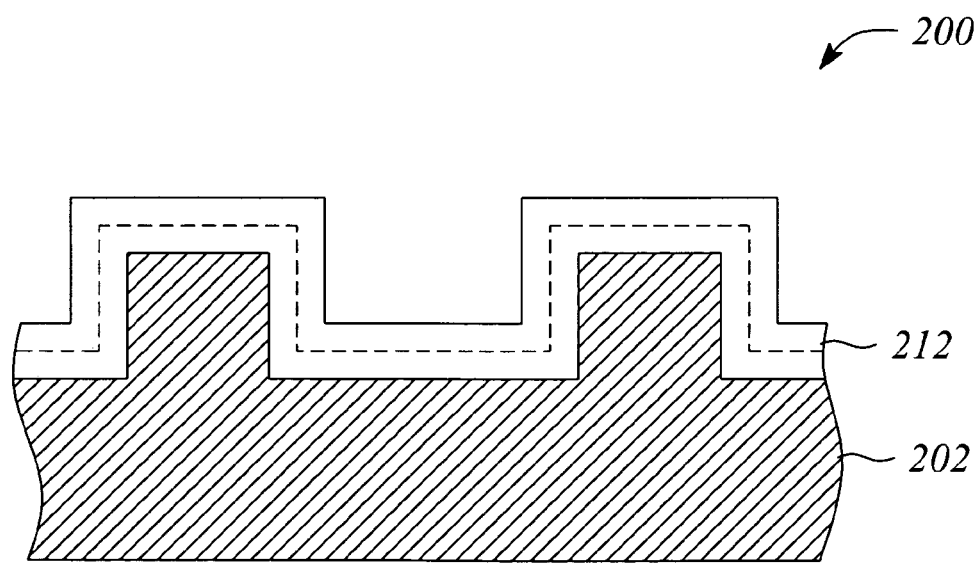
Figure 2C:
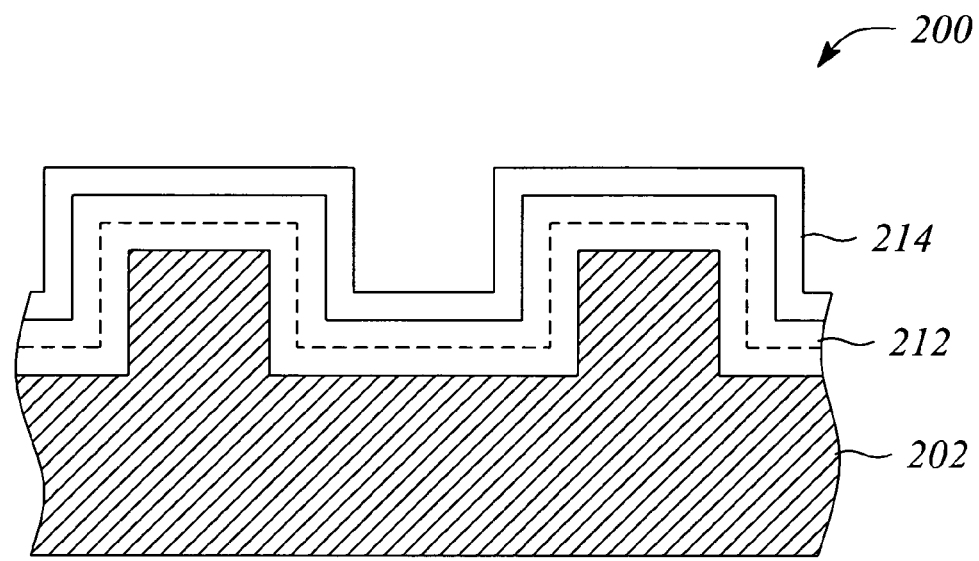
Figure 2D:
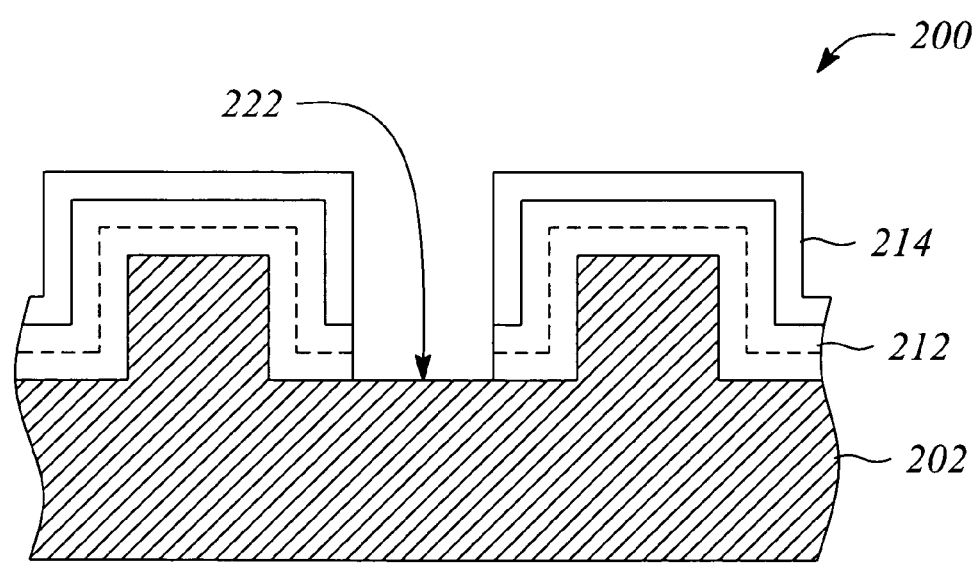

Referring to FIG. 1C and FIGS. 2D–2G, in some embodiments, forming 120 an additional nanowire feature on the mold 200 comprises removing 122 the oxide layers from the trench bottom using a directional and/or a selective etching process. Referring to FIG. 2D, the oxide layers 212, 214 are selectively removed 122 from the trench bottom 222, such that the embedded portion of the thermal oxide layer 212 (between the dashed line and the cross-hatching) also is removed 122. The mold core thickness at the etched trench bottom 222 is the unoxidized reduced thickness $C_r$. Moreover, while not shown in FIG. 2D, directional etching using RIE will remove the oxide layers 212, 214 from other horizontal surfaces, such as on top of the nanowire features, at least partially, unless the surfaces are protected with an etch mask.

The oxide layers 212, 214 are selectively removed 122 from the trench bottom 222 using known techniques including, but not limited to, reactive ion etching (RIE), which provides directional or anisotropic selective etching of the oxides and not the mold core 202. For example, when the mold 200 is a silicon wafer and the oxide layers 212, 214 are silicon dioxide layers, RIE will directionally etch the silicon dioxide in a horizontal plane along the trench bottom 222 much more than it will etch the silicon dioxide in a vertical plane of the trench. Other dry or wet etching techniques known in the art to provide selective anisotropic etching of the oxide layers may be used instead of or in addition to RIE, according to the method 100.

Figure 2E:
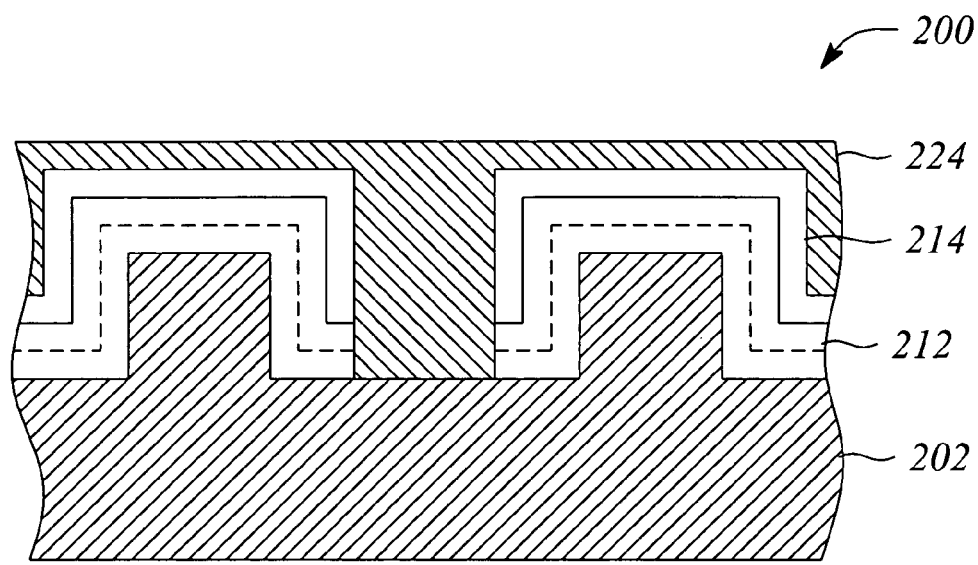

Forming 120 further comprises adding 124 a material 224 to the etched trench bottom 222 that also fills the trench, which will ultimately become an added nanowire 224. Referring to FIG. 2E, the material 224 may be added 124 using a deposition technique known in the art including, but not limited to, epitaxial growth using chemical vapor deposition (CVD) or molecular beam epitaxy (MBE).

The added material 224 is selected from materials that integrate with the mold core material during adding 124 to provide similar material and/or mechanical characteristics to the mold core material and includes using a material the same as the mold core 202. Such added material 224 is distinguished from a conventional method of adding a metal to a semiconductor mold core to form metal nanowires alternating with semiconductor nanowires, since the metal nanowires and semiconductor nanowires have different material and/or mechanical characteristics.

For example, when the mold core material is silicon, the added material 224 may be epitaxial-grown silicon with well-defined crystallographic boundaries according to some embodiments of the present invention. In this example, the epitaxial or single crystalline silicon may be grown in a chemical vapor deposition reactor to at least fill the trench. Alternatively, an amorphous silicon material 224 may be deposited or added 124 to the trench using PECVD, e-beam evaporation or sputtering, for example. In another example, when the mold core material is a metal, such as titanium, the added nanowire material 224 may be a metal material with similar characteristics to the metal core, such as using added titanium to a titanium mold core. Ti can be deposited by one or more of evaporation, sputtering, and CVD.

In still another example, when the metal core is titanium, the added material 224 may be deposited $TiSi_2$, for example. The added $TiSi_2$ 224 is deposited such that it does not necessarily consume the surface on which it is deposited relative to the exemplary $TiSi_2$ sacrificial sheath that is grown and/or deposited to consume 110 the Ti surface, as described above. Moreover, contact between the added $TiSi_2$ 224 and the Ti surface is restricted to the exposed Ti core in the etched trench. Regardless of the material of the core and of the added nanowire, a flexibility exists according to the embodiments of the method 100 such that the sacrificial sheath or consumption layer is grown on the surface using the mold core material in its formation, while the added material 224 is deposited on the etched surface to form the added nanowire that is integral with the mold core.

With respect to the above example using $TiSi_2$ as the added material 224, the nano-scale structure that results from the method 100 is a nano-scale device (or nano-device) instead of a nano-imprinting mold. This nano-device has nano-scale features including both Ti core nanowires and $TiSi_2$ nanowires. This nano-device is useful for sensing, for example, in which selectivity is desired. For example, a species being sensed by this nano-sensor may have different binding characteristics to the different nanowire materials.

Figure 2F:
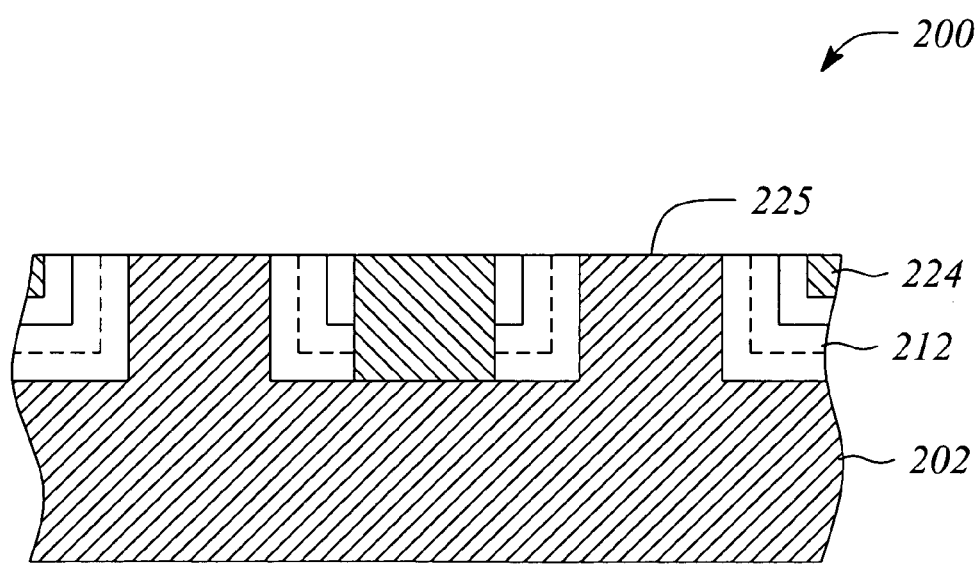

In some embodiments of adding 124, the material 224 is added 124 to completely fill the trench and cover exposed surfaces of the oxide layer 214 on the mold 200, as illustrated by way of example in FIG. 2E. In these embodiments, forming 120 further comprises removing the layers 212, 214, 224 along a horizontal plane, such that a surface 225 of the mold core 202 is exposed and the surface 225 is planar with the added material 224 in the trench, as illustrated in FIG. 2F, but not in FIG. 1C. Removing the layers along a horizontal plane may be accomplished by using a planarization technique including, but not limited to one or more of a chemical and mechanical polishing (CMP), chemical polishing, mechanical polishing, and ion milling, depending on the embodiment, to achieve a targeted smoothness of the top horizontal surfaces. In some embodiments, the layers 212, 214, 224 are removed along the horizontal plane down to about the oxide or encroachment depth. In these embodiments, the resulting planar surface 225 is at or below the oxide depth $Ox_{1d}$ of the embedded portion of the thermal oxide layer 212 at the apex of the nanowire pair. As such, the method 100 also reduces a height $N_{1h}$ dimension of the preexisting nanowire features in the mold core 202.

Referring again to FIGS. 1C and 2G, forming 120 further comprises removing 126 a remainder of the oxide layers in the trench to create sub-trenches 226 on either side of the added material 224 to isolate the added material 224. The isolated material 224 becomes the additional nanowire feature 224 in the original trench between the preexisting nanowire features. The resultant mold is a nano-imprinting mold 200' with reduced feature dimensions, such as a reduced one or more of a width dimension, a pitch dimension, a spacing dimension and a height dimension of the features, according to the embodiments of the present invention. The oxide layers 212, 214 are selectively removed 126, including the oxide sheath 212 to the oxide depth $Ox_{1d}$, from the trench such that the sub-trench 226 is formed with a width $S_w$ that is equal to a combined thickness $(Ox_1+Ox_2)$ of the oxide layers 212, 214, including the embedded thickness $Ox_{1d}$ of the thermal oxide layer 212. For example, when the oxide layers are silicon dioxide, the oxide layers are selectively removed 126 using wet chemical etching in hydrofluoric acid. The silicon core and epitaxial silicon are relatively unaffected by the wet chemical etching of the silicon dioxide. The removal 122, 126 of the oxide layers 212, 214 in effect removes the so-called 'sacrificial shell' or 'sheath' formed during consuming 110, as describe above.

According to the various embodiments of the method 100, forming 120 an additional nanowire using the removal processes described above ensures essentially vertical sidewalls and planar surfaces of the resultant nano-scale features, which are desirable for the nano-imprinting mold 200' or other nano-scale device 200'. For example, removing 122, 126 the oxide layers use directional etching to ensure the essentially vertical nanowire sidewalls and essentially planar sub-trench bottoms. Moreover, those embodiments that also use a planarization technique ensure essentially planar horizontal nanowire end or apex surfaces.

The method 100 of reducing feature dimensions further reduces the width $N_{1w}$ of each preexisting nanowire of the mold core 202 by two times the thickness $Ox_{1d}$ of the embedded portion of the thermal oxide layer 212 to a reduced width $N_{1rw}$ (i.e., $N_{1rw} = N_{1w} - 2Ox_{1d}$) of the mold core 202'. The added nanowire has a width $N_{2w}$ equal to a width $T_w$ of the preexisting trench of mold core 202 before consumption 110 that is reduced by the thickness $Ox_2$ of the second oxide layer 214 and a thickness $(Ox_1 - Ox_{1d})$ of a non-embedded portion of the thermal oxide layer 212 times two (i.e., $N_{2w} = T_w - 2(Ox_2 + (Ox_1 - Ox_{1d}))$) of the nano-imprinting mold 200'. The method 100 of reducing feature dimensions further reduces a pitch P of the preexisting nanowires, defined as the width $N_{1w}$ of a preexisting nanowire and the width $T_w$ of the preexisting trench between adjacent preexisting nanowires, to a reduced pitch $P_r$ equal to the reduced nanowire width $N_{1rw}$ plus the sub-trench width $S_w$ (i.e., $P_r = N_{1rw} + S_w$) of the nano-imprinting mold 200'.

In effect, the method 100 of reducing feature dimensions decreases one or more of a core width, a core height and a core depth at least of a first imprintable feature (i.e., one or both of a nanowire and a trench). For example, a core width $N_{1w}$ dimension of each preexisting nanowire is reduced in proportion to a depth $Ox_{1d}$ that the thermal oxide encroaches into the mold core 202. Further, repeating the method 100 on the nano-imprinting mold 200' will further add additional nanowires and decrease the width dimension of each existing nanowire (i.e., the reduced core width $N_{1rw}$ of the preexisting nanowires and the width $N_{2w}$ of the added nanowire), proportionally as described above. As a result, the collective nanowires have one or both of a closer spacing, in part due to the additional nanowires between adjacent nanowires, and a smaller pitch, in part due to the reduced nanowire width from the consumption 110 (i.e., one or both of $N_{1rw}$ and $N_{2rw}$). The closer spacing and smaller pitch is relative to the preexisting imprinting mold 200 before the method 100 is used to reduce feature dimensions, and further relative to before the method 100 is repeated on the nano-imprinting mold 200'.

As an example, a preexisting silicon imprinting mold has initial nanowires formed in the mold core with an initial nanowire core width $N_{1w}$ about 40 nm, an initial nanowire height $N_{1h}$ about 100 nm, and an initial nanowire spacing (trench width) $T_w$ about 80 nm. The initial pitch P is 120 nm. A thermal oxide layer 212 with a thickness $Ox_1$, of about 10.9 nm reduces the silicon nanowire core width $N_{1w}$ to $N_{1rw}$ equal to about 30 nm and the trench width $T_{rw}$ to about 68.2 nm. In this example, it is assumed that about 46% of the thermal oxide thickness $Ox_1$ will embed into the mold core during thermal oxidation. As such, the embedded thickness $Ox_{1d}$ equals about 5 nm so that the reduced nanowire core width $N_{1rw}$ equals $N_{1w} - 2 Ox_{1d}$ or $(\sim 40 - 2(\sim 5)) =$ about 30 nm, and the trench width $T_w$ is reduced by $T_w - 2(Ox_1 - Ox_{1d})$ or $(\sim 80 - 2(\sim 10.9 - \sim 5)) =$ about 68.2 nm.

However, assume that for this example that one desires a 30 nm trench width $T_{rw}$, then another oxide layer 214 is deposited (e.g., PECVD oxide) over the thermal oxide layer 212 that has a thickness $Ox_2$ about 19.1 nm. The oxidized trench bottom is then exposed down to the mold core using RIE, for example, of the oxide layers to expose about a 30 nm wide mold core surface of the trench bottom in the oxidized trench. In other words, the exposed mold core width in the trench bottom equals $T_w - 2((Ox_1 - Ox_{1d}) + Ox_2)$ or $\sim 80 - 2((\sim 10.9 - \sim 5) + \sim 19.1) =$ about 30 nm. A silicon nanowire material is added to exposed mold core surface of the trench bottom to a thickness of about 130 nm, such as by epitaxial silicon deposition in a CVD reactor, for example. A horizontal surface of the mold is polished using CMP, for example, to a depth of about 50 nm followed by removing the remaining oxide materials, such as with wet chemical etching, for example.

In this example, a mold pattern with reduced feature dimensions according to various embodiments of the present invention results. The mold pattern includes nanowires with a width $N_{1rw}$, $N_{2w}$ of about 30 nm, a height $N_{1rh}$, $N_{2h}$ of about 80 nm (i.e., $\sim 130$ nm$- \sim 50$ nm), a spacing or sub-trench width $S_w$ of about 30 nm (i.e., $Ox_1 + Ox_2 = \sim 10.9 + \sim 19.1$), and a resultant pitch $P_r$ of about 60 nm (i.e., $N_{1rw} + S_w$ or $N_{2w} + S_w$) or about one half of the initial pitch P of about 120 nm. Then the method 100 can be repeated on the resultant mold until a desired or target nanowire width and pitch are achieved. In other words, each time the method 100 is sequentially performed on a previous resultant mold, the number of nanowires increases. Further, the nanowire width and pitch dimensions will be reduced in a current resultant mold to approximately half of those dimensions of the previous resultant mold.

In some embodiments of the method 100, the method 100 further comprises providing the preexisting imprinting mold before consumption 110 and formation 120. The preexisting imprinting mold may be provided using an off-the-shelf imprinting mold in some embodiments. Alternatively, the imprinting mold may be fabricated using techniques mentioned above including, but not limited to, e-beam lithography, x-ray lithography and an anisotropic etching, such as a dry etching technique including, but not limited to, RIE or plasma etching in some embodiments to form features in a mold substrate. In these alternative embodiments, the method 100 of reducing feature dimensions is a method of fabricating a nano-scale device or structure with reduced feature dimensions according to the present invention. The method of fabricating is described herein with respect to fabricating a nano-imprinting mold by way of example and is intended to include within its scope the fabrication of other nano-scale devices, as mentioned above.

The method of fabricating comprises forming imprintable features separated by trenches on a mold substrate. FIG. 2A illustrates the imprintable features thus formed. In some embodiments, the imprintable features include features with dimensions (e.g., height, width and spacing) in a typical range, as defined above. The imprintable features are formed in or on the mold core or substrate using the techniques mentioned above. U.S. Pat. Nos. 6,309,580 and 5,772,905, incorporated by reference herein, and K. Early, M. L. Schattenburg, and H. I. Smith, "Absence of Resolution Degradation in X-ray Lithography for λ from 4.5 nm to 0.83 nm", *Microelectronic Engineering*, 11, 317 (1990); S. Y. Chou, P. R. Krauss, and P. J. Renstrom, "Imprint Lithography with 25-Nanometer Resolution", *Science*, 272, 85

(1996); and Y. Chen et al., "Nanoscale molecular-switch devices fabricated by imprint lithography", *Applied Physics Letters*, 82 (10), 1610 (2003) provide information regarding e-beam lithography, x-ray lithography and anisotropic etching techniques for nano-scale device fabrication. The method of fabricating further comprises any of the embodiments of the consumption 110 process and the formation 120 process, as described above for the method 100 of reducing feature dimensions.

Figure 3:
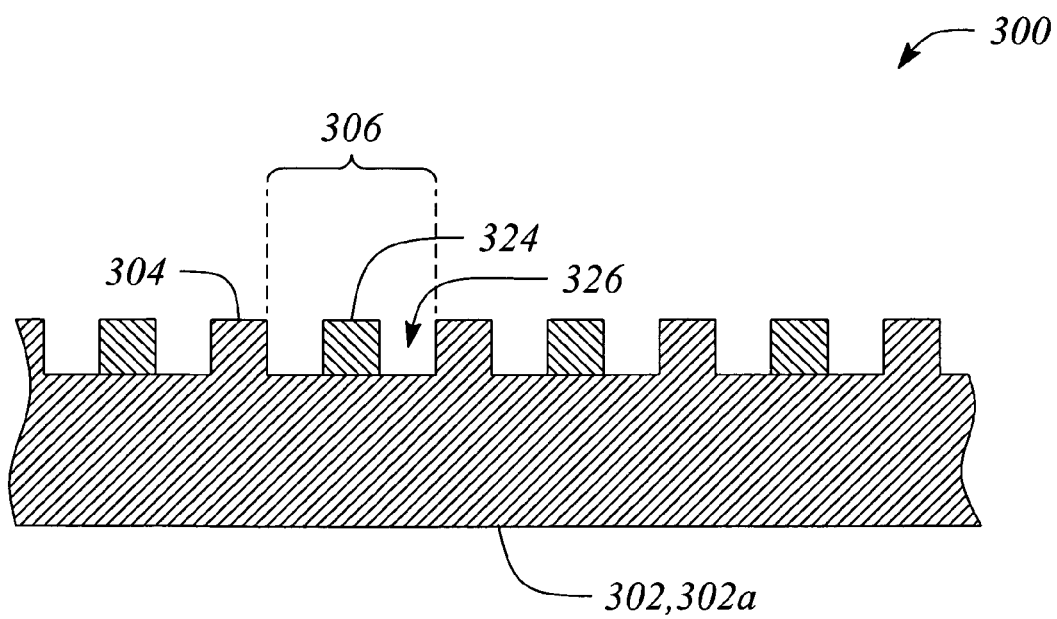
FIG. 3 illustrates side view of a nano-scale device with reduced feature dimensions according to an embodiment of the present invention.

FIG. 3 illustrates a side view of a nano-scale device with reduced feature dimensions according to an embodiment of the present invention. The nano-scale device 300 will be described with respect to the exemplary nano-imprinting mold 300 embodiment. The nano-imprinting mold 300 has reduced feature dimensions relative to a preexisting mold that has not had feature dimension reduction according to the various embodiments of the present invention. The nano-imprinting mold is used to imprint a negative of a reduced feature mold pattern on a substrate surface. The negative pattern facilitates forming structures, such as nanowires or other circuit elements, on the substrate surface in the manufacture of nano-scale devices. The techniques for nano-imprinting with molds are known, for example from U.S. Pat. Nos. 5,772,905; 6,309,580; 6,294,450 and 6,407,443, all of which are incorporated herein by reference in their entirety. These techniques are not intended to limit the scope of the many ways that the imprinting mold of the present invention may be used in imprint lithography by those skilled in the art. A method of imprinting nano-structures with the nano-imprinting mold of the present invention is described below.

Referring to FIG. 3, the nano-imprinting mold 300 with reduced feature dimensions comprises first nanowires 304 shaped or formed on a mold substrate 302 having a mold core 302a. The first nanowires 304 are spaced apart by trenches 306 in or on the mold substrate 302. The first nanowires 304 may be considered as a pattern or plurality of spaced apart first nanowires 304 wherein a trench or gap 306 between adjacent first nanowires spatially separates them. A first nanowire 304 is a vertically extending (i.e., imprintable) portion of the mold core 302a. The first nanowire 304 extends from a horizontal plane of the mold substrate 302. The horizontal plane is defined by the trench bottoms therebetween, such that an apex of the first nanowire 304 is typically a high point of the mold core 302a and a trench bottom is typically a low point of the mold core 302a. The first nanowires 304 are made of the mold core 302a. The first nanowires 304 are shaped or formed typically using techniques including, but not limited to, one or more of e-beam lithography, x-ray lithography and anisotropic etching, such as reactive ion etching (RIE), as described above.

The nano-imprinting mold 300 further comprises a second nanowire 324 added to the mold substrate 302 in at least one of the trenches 306 between adjacent first nanowires 304. The second nanowire 324 is added such that it is spaced from each of the adjacent first nanowires 304 by sub-trenches 326 which are narrower than the trenches 306. The second nanowire 324 differs from the first nanowires 304 in that the second nanowire 324 is not shaped or formed in and of the mold core 302a. Instead, the second nanowire 324 is made of a material added to or deposited on the mold substrate 302 (i.e., the surface of the trench bottom). The second nanowire 324 is added onto the mold substrate 302 by a material deposition process using techniques that are known in the art, including but not limited to, CVD, plasma enhanced CVD (or PECVD), molecular beam epitaxy (MBE), metal-organic CVD (MOCVD), sputtering and evaporation. For example, the material of the second nanowire 324 may be added silicon, such as epitaxial-grown silicon, when the mold substrate 302 is a silicon wafer having a silicon mold core 302a.

The second nanowire 324 added in the trench 306 between adjacent first nanowires 304 effectively decreases a feature dimension, such as a spacing $T_w$ between the first nanowires 304 to a spacing between adjacent nanowires 304, 324 of the nano-imprinting apparatus 300 equal to the width $S_w$ of the sub-trench 326. The decrease in the spacing $T_w$ dimension is proportional to a width of the second nanowire 324 in the trench 306.

In some embodiments of the nano-imprinting mold 300, a core width dimension $N_{1w}$ of the first nanowires 304 is also decreased by and when the second nanowire 324 is added in the trench 306. In such embodiments, the added second nanowire 324 further effectively decreases a pitch P of the first nanowires 304 to a pitch $P_r$ of the collective adjacent nanowires 304, 324 of the nano-imprinting mold 300. In some embodiments, the decrease in the core width of the first nanowires 304 and the decrease in the pitch are a result of the consumption of the mold core and etching of the consumed mold core to form the second nanowire 324, such as the consumption 110 and the removal 122, 126 described above for the method 100 of reducing feature dimensions.

In some embodiments, the nano-imprinting mold 300 comprises the first nanowires 304, as described above, and means for reducing a dimension of the first nanowires. In these embodiments, the means for reducing a dimension is the second nanowire 324 that effectively decreased one or more of a width dimension of the first nanowires 304, a spacing dimension between adjacent nanowires 304, 324 and a pitch dimension between adjacent nanowires 304, 324.

In some embodiments not illustrated, the nano-imprinting mold 300 may further comprise an additional nanowire in a sub-trench 326 between a first nanowire 304 and a second nanowire 324 illustrated in FIG. 3. The additional nanowire effectively reduced or decreased the feature dimensions of the nano-imprinting mold 300 further. For example, the reduced spacing $S_w$, the reduced pitch $P_r$, the reduced core width $N_{1rw}$ of the first nanowire 304, and a width $N_{2w}$ dimension of the second nanowire 324, all as described above, are further reduced by such additional nanowire. As a result, the nano-imprinting mold 300 of the present invention acquires progressively or incrementally smaller feature dimensions with each separately added nanowire or set of added nanowires in accordance with the various embodiments of the method 100 of the present invention. As such, nano-scale structures or devices with concomitantly smaller dimensions may be achieved during a nano-imprint lithography process with the nano-imprinting mold 300.

An example of nano-structure fabrication by imprint lithography using the nano-imprinting mold 300 of the present invention is described with reference to FIGS. 4A–4E. Nano-imprinting mold 200' of FIG. 2G also may be used. Nano-imprinting, as used herein, involves imprinting a negative image of a pattern of the imprinting mold 300 into a material relatively softer than the mold 300. The softer material retains the imprinted pattern after the mold 300 is removed during further processing (see FIGS. 4A–4B). Typically, a layer of a thermoplastic polymer or UV-curable monomer or other suitable material is applied over a substrate comprising one or both of a semiconductor material and metal material. Thermoplastic polymers, such as polymethylmethacrylate (PMMA) and methylmethacrylate (MMA), or other suitable materials are described in U.S. Pat. No. 6,294,450 to Chen et al., which has been incorporated herein by reference. The imprinted pattern in the soft material layer is then transferred into the substrate as a positive image of the mold through lithography and etching, for example. The transferred pattern can be used for further processing in the formation of reduced dimensioned nano-scale structures, such as nanowires. There are many ways of transferring the pattern into the substrate. The method described herein is exemplary and provided with the understanding that the embodiments of the present invention are not so limited to the described method.

Figure 4A:
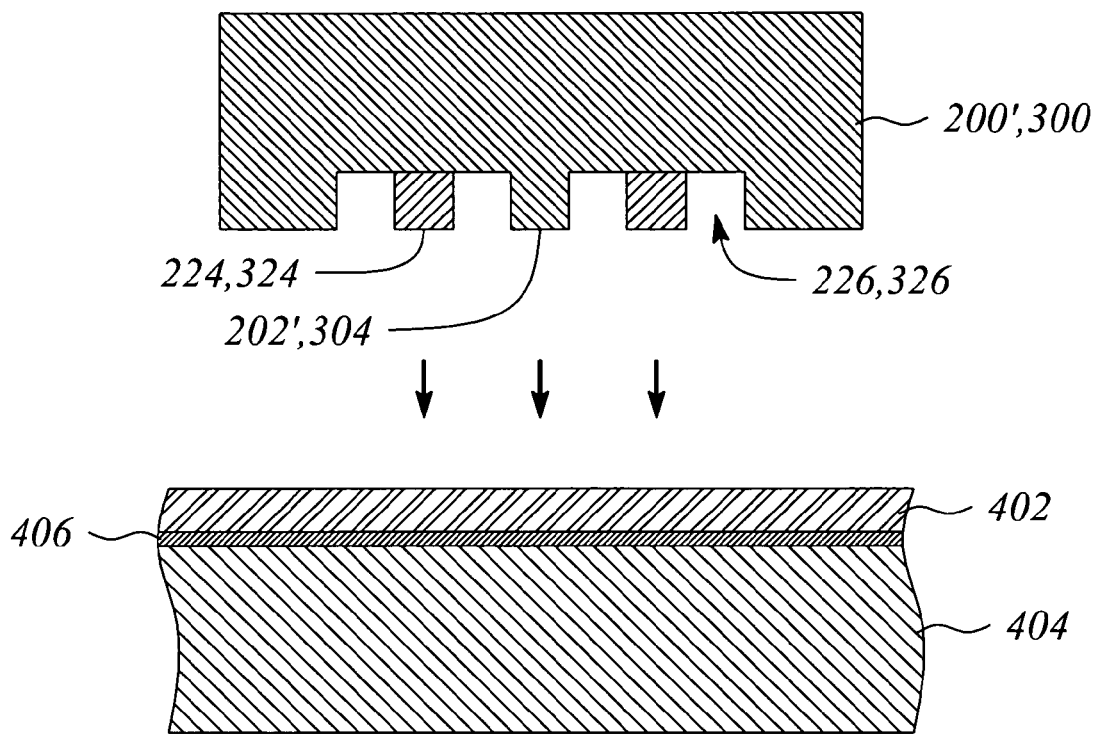
FIGS. 4A–4E illustrate side views of exemplary nanostructures being fabricated on a substrate using a nano-imprinting mold of FIG. 3 according to an embodiment of the present invention.
Figure 4B:
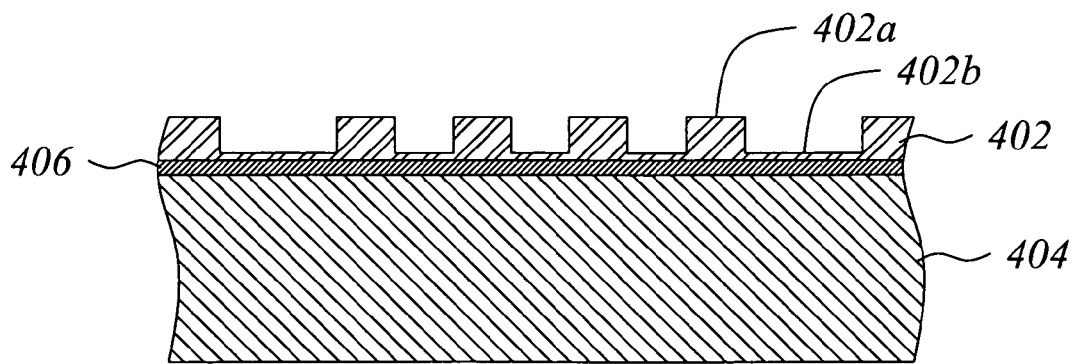
Figure 4C:
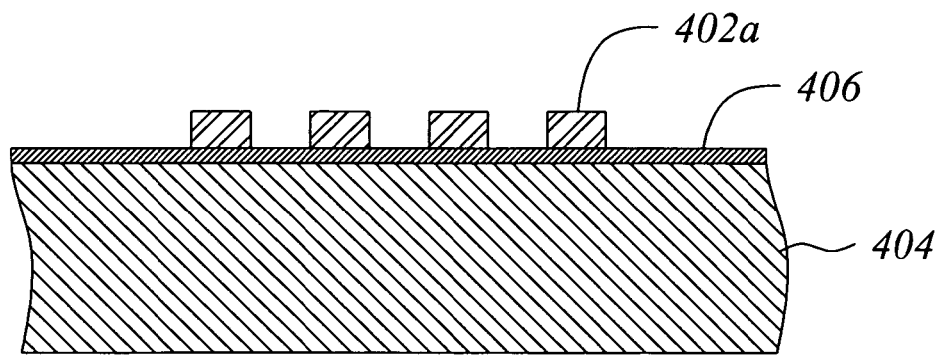
Figure 4D:
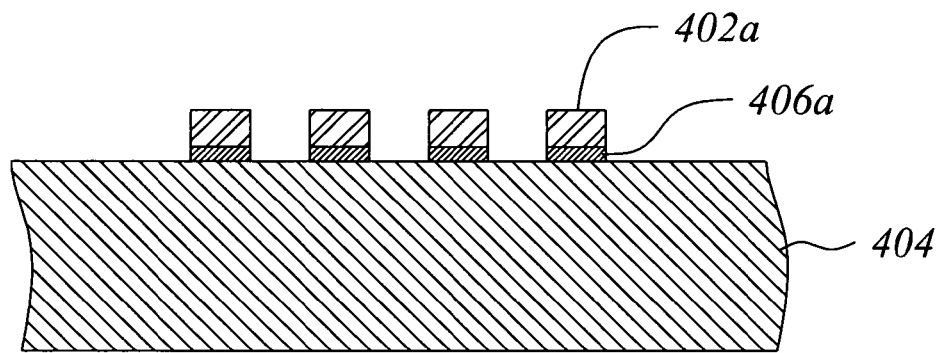
Figure 4E:
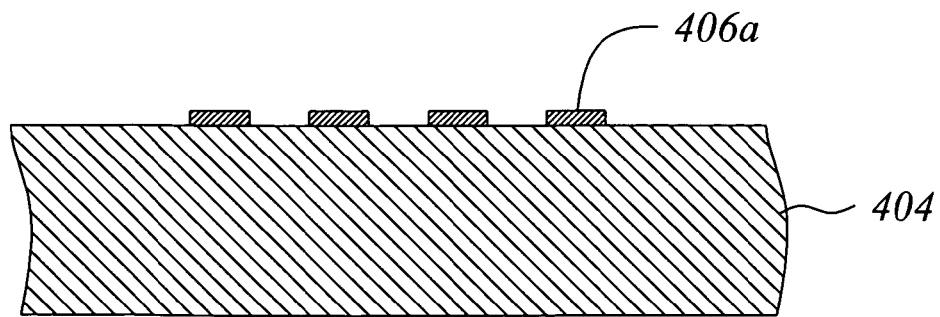

As illustrated in FIG. 4A, the device substrate comprises a metal layer 406 deposited in a nano-scale thickness on a surface of a substrate 404. The suitable soft material 402 is applied over the deposited metal 406. The nano-imprinting mold 300, 200' of the present invention is pressed into the softer material 402 and then retreated, leaving the mold pattern in the soft material, as illustrated in FIG. 4B. The mold pattern has thick portions 402a and relatively thinner portions 402b. The thinner portions 402b of the soft material 402 are removed, such as by etching with an etchant that removes the soft material 402 in the thin portions 402b but that does not etch the metal layer 406. As illustrated in FIG. 4C, portions of the metal layer 406 are exposed after the removal of the thinner portions 402b of the soft material 402. The exposed portions of the metal layer 406 are then removed using techniques, such as etching, thereby leaving only those portions 406a of the metal layer 406 covered by the thicker portions 402a of the soft material 402, as illustrated in FIG. 4D. These portions directly correspond to the trenches 326, 226 in the mold 300, 200'. FIG. 4E illustrates the substrate 404 with the remaining soft material 402a removed from the remaining metal portions 406a. The remaining metal portions 406a in FIG. 4E represent nano-structures 406a. Depending on the mold pattern and the embodiment, the nano-structures may be nanowires that run parallel to each other, for example, on the surface of the substrate, or that form a circuit pattern. The nano-structures thus formed lithographically using the nano-imprinting mold 300, 200' are useful in many applications, such as nano-scale photonic, electronic, sensing, nanofluidic and catalysis applications, for example.

Figure 2G:
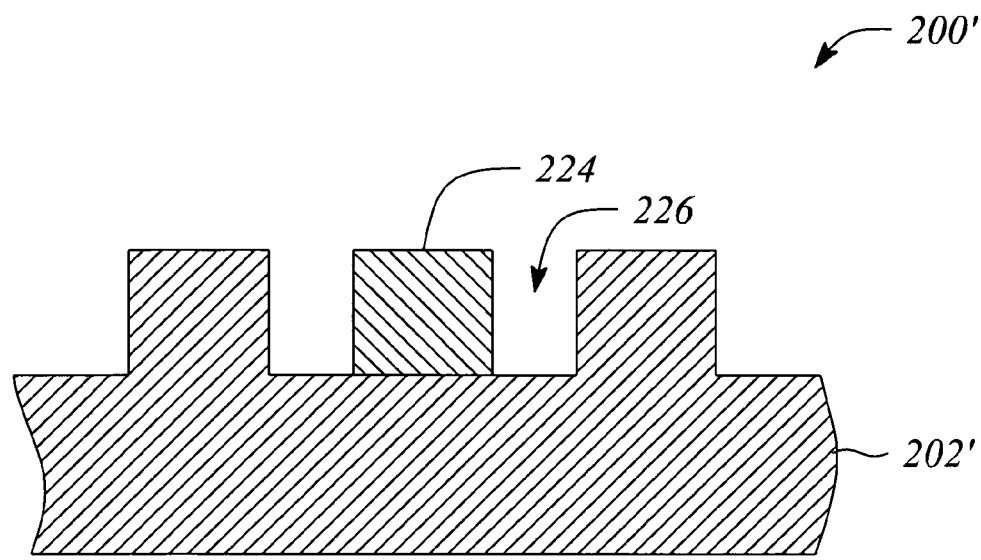

In some embodiments, the nano-scale device 200', 300 illustrated in FIGS. 2G and 3 is useful for various other applications instead of a nano-imprinting mold 200', 300 used for imprint lithography. This is due to a flexibility over the choice of material systems used to fabricate the device 300', 300, according to some embodiments of the present invention. Therefore, embodiments of the nano-scale device 200', 300 may be used directly in various applications, such as photonics, electronics, sensing, nanofluidics, and catalysis. This is in contrast to using the nano-scale device 200', 300 as the imprinting mold 200', 300, as described above with respect to FIGS. 4A to 4E, for example, to fabricate nano-structures and devices for the various applications. For example, as was mentioned above, nano-scale features can be fabricated according to embodiments of the method 100 on a metal substrate, such as a Ti substrate, as closely spaced first and second nanowire features of Ti and $TiSi_2$ materials, respectively. Such a nano-device is useful in sensing applications. The close spacing of the nanowires is due to a dimension reduction 100 or consumption 110 of at least the first or Ti nanowires during fabrication. As such, the embodiments of the present invention provide a variety of nano-devices having closely spaced features for various applications due to the flexibility in material system choices, in addition to the nano-imprint mold device used in imprint lithography applications.

Thus, there have been described various embodiments of a nano-imprinting mold with reduced feature dimensions, a method of reducing feature dimensions on an imprinting mold, and a method of fabricating a nano-imprinting mold with reduced feature dimensions. More generally, there have been described various embodiments of a nano-scale device with closely spaced features and a method of fabrication thereof that includes reducing a feature dimension of the device. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of reducing feature dimensions of a nano-scale device comprising:
consuming a surface of a device substrate, the device having a pattern of spaced apart first nanowires on the surface, the consumption reducing a dimension of the first nanowires; and
forming a second nanowire in a trench between adjacent ones of the first nanowires, such that the device comprises a set of features that includes the first nanowires with the reduced dimension and the second nanowire spaced from the adjacent first nanowires by sub-trenches.

2. The method of reducing of claim 1, wherein forming comprises:
adding a material to the trench to fill the trench, the consumed surface in a bottom of the trench being selectively removed to expose a substrate core before adding, the added material being the second nanowire.

3. The method of reducing of claim 2, wherein adding comprises depositing the material in the trench, the material having a similar characteristic to a material of the substrate core.

4. The method of reducing of claim 1, wherein consuming comprises:
growing a consumption layer on the surface of the substrate that encroaches into the surface to an encroachment depth, the consumption layer comprising a material of the mold and a first material combined with the mold material; and
depositing a layer of a second material on the consumption layer.

5. The method of reducing of claim 4, wherein the substrate material is silicon, the consumption layer and the second material being independently an oxide of silicon, the consumption layer being a thermal oxide of the silicon substrate, the second material layer being deposited silicon dioxide.

6. The method of reducing of claim 4, wherein the substrate material is a metal selected from titanium, tungsten, platinum, silver, and copper, the consumption layer and the second material being a compound independently selected from an oxide, a nitride, a silicide, a sulfide, and a carbide of the selected metal, the second material layer being a deposited selected second material compound.

7. The method of reducing of claim 6, wherein the first material is selected from one of oxygen, nitrogen, silicon, sulfur and carbon deposited to combine with the selected substrate material to form the respective selected consumption layer compound.

8. The method of reducing of claim 4, wherein forming comprises:

removing the layers from a bottom of the trench to the encroachment depth;

depositing a nanowire material in the trench to fill the trench from the encroachment depth; and removing a remainder of the layers in the trench.

9. The method of reducing of claim 8, wherein removing the layers comprises:

directionally etching the layers from the bottom of the trench; and selectively removing the remainder of the layers from in the trench to create the sub-trenches on either side of the deposited nanowire material.

10. The method of reducing of claim 8, wherein forming further comprises:

planarizing the substrate along a horizontal plane, such that at least the deposited nanowire material and the layers are removed along the horizontal plane to the encroachment depth before the removal of the remainder of the layers.

11. The method of reducing of claim 10, wherein planarizing comprises using one or more of chemical mechanical planarization (CMP), chemical polishing, mechanical polishing and ion milling to achieve a targeted surface smoothness.

12. The method of reducing of claim 1, wherein the substrate is a material selected from a semiconductor and a metal, and wherein the formed second nanowire is one of the selected material of the substrate and a compound of the selected substrate material.

13. The method of reducing of claim 12, wherein the compound is selected from an oxide, a nitride, a silicide, a sulfide, a carbide of the selected substrate material.

14. The method of reducing of claim 12, wherein the semiconductor substrate material is selected from silicon and germanium.

15. The method of reducing of claim 12, wherein the metal substrate material is selected from titanium, tungsten, platinum, silver and copper.

16. The method of reducing of claim 1, further comprising:

repeating consuming and forming to increase a number of the nanowires in the feature set, such that the nanowires are spaced closer together on the device.

17. The method of reducing of claim 16, wherein repeating incrementally decreases a core width of each nanowire.

18. The method of reducing of claim 1, wherein the reduced dimension of the first nanowires is one or more of a nanowire width, a nanowire height, and a nanowire spacing at least within the feature set.

19. The method of reducing of claim 1, wherein the nanowires of the feature set have one or both of a closer spacing and a smaller pitch relative to the first nanowires of the pattern before forming.

20. The method of reducing of claim 1, wherein consuming decreases a width dimension of each first nanowire in proportion to a depth that the substrate surface is consumed.

21. The method of reducing of claim 1, wherein the nano-scale device is a nano-imprinting mold with the set of features, the nano-imprinting mold being used for nano-imprint lithography, the set of features facilitating imprinting closely spaced features relative to the nano-imprinting mold before consuming and forming.

22. The method of reducing of claim 1, wherein the nano-scale device with the set of features is used in one or more of photonic, electronic, sensing, nanofluidic and catalysis applications.

23. A method of reducing feature dimensions of a silicon imprinting mold comprising:

oxidizing a surface of the silicon imprinting mold, the mold having a pattern of spaced apart first nanowires on the surface, the oxidation reducing a core dimension of the first nanowires; and forming a second nanowire in a trench between adjacent ones of the first nanowires, such that the mold comprises a set of imprintable features that includes the first nanowires with the reduced core dimension and the second nanowire spaced from the adjacent first nanowires by sub-trenches.

24. The method of reducing of claim 23, wherein oxidizing comprises:

thermally oxidizing the surface, such that a thermal oxide layer both covers the surface and embeds into the first nanowires to an oxide depth; and depositing an oxide layer on the thermal oxide layer.

25. The method of reducing of claim 23, wherein forming comprises:

removing the oxide layers from a bottom of the trench to the oxide depth;

adding silicon in the trench to fill the trench from the oxide depth; and removing a remainder of the oxide layers in the trench.

26. The method of reducing of claim 25, wherein forming further comprises:

planarizing the silicon mold along a horizontal plane, such that at least the added silicon and the oxide layers are removed along the horizontal plane to the oxide depth before the removal of the remainder of the oxide layers.

27. The method of reducing of claim 25, wherein adding silicon in the trench comprises epitaxially growing the silicon.

28. A method of fabricating a nano-scale device with reduced feature dimensions comprising:

forming a plurality of spaced apart first nanowire features on a surface of a substrate, the first features being spaced apart from one another by first gaps;

consuming the surface of the substrate, such that the consumed surface reduces a core dimension of the first features; and forming a second nanowire feature in a first gap between adjacent first features, such that the device has a set of nanowire features that comprises the reduced-dimension first features and the second feature separated from the first features by second gaps that are narrower than the first gaps.

29. The method of fabricating of claim 28, wherein forming a plurality of first nanowire features comprises using one or more of e-beam lithography, x-ray lithography and anisotropic etching of the substrate.

30. The method of fabricating of claim 28, wherein forming a second nanowire feature comprises:

adding a material of the second feature to fill the first gap, the consumed surface being removed from a bottom of the first gap to expose the substrate before adding the material.

31. The method of fabricating of claim 28, wherein consuming comprises:

growing a consumption layer on the surface of the substrate that encroaches into the surface to an encroachment depth, the consumption layer comprising a material of the substrate and a first material deposited to combine with the substrate material; and depositing a layer of a second material on the consumption layer.

32. The method of fabricating of claim 31, wherein forming a second nanowire feature comprises:
    directionally etching the layers from a bottom of the first gap to the encroachment depth;
    adding a material of the second feature to the etched gap bottom such that the added material fills the gap; and
    selectively removing a remainder of the layers from in the first gap to create the second gaps on opposite sides of the added material, the added material being the second nanowire feature.

33. The method of fabricating of claim 32, further comprising:
    planarizing the substrate along a horizontal plane, such that at least the added material and the layers are removed from the substrate along the horizontal plane to the encroachment depth before selectively removing the remainder of the layers from the first gap to create the second gaps.

34. The method of fabricating of claim 33, wherein planarizing comprises using one or more of chemical mechanical planarization (CMP), chemical polishing, mechanical polishing and ion milling to achieve a targeted surface smoothness.

35. The method of fabricating of claim 32, wherein directionally etching uses reactive ion etching to selectively etch the layers from the first gap bottom, and wherein selectively removing uses wet chemical etching to remove the remainder of the layers from the first gap.

36. The method of fabricating of claim 32, wherein the substrate is made of silicon, the consumption layer being a thermal oxide layer of silicon, the second material layer being deposited silicon dioxide, the added feature material being an epitaxially grown silicon.

37. The method of fabricating of claim 32, wherein the substrate is made of a metal, the consumption layer and the second material being independently a compound of the metal, the added feature material being one of the metal and the compound of the metal deposited in the first gap.

38. The method of fabricating of claim 37, wherein the metal is selected from titanium, tungsten, platinum, silver and copper, and wherein the compound is selected from an oxide, a nitride, a silicide, a sulfide and a carbide of the selected metal.

39. The method of fabricating of claim 31, wherein a core width of each reduced-dimension first nanowire feature is reduced by twice the encroachment depth, a width of the second nanowire feature being approximately equal to a width of the first gap minus twice a combined thickness of the layers, each second gap having a width equal to the combined thickness of the layers.

40. The method of fabricating of claim 28, wherein the nano-scale device is used in one or more of imprint lithography, photonic, electronic, sensing, nanofluidic and catalysis applications.

41. A method of fabricating a nano-imprinting mold with reduced feature dimensions comprising:
    forming a plurality of spaced apart first nanowires on a surface of a silicon substrate to create a silicon imprinting mold, the first features being spaced apart from one another by trenches;
    thermally oxidizing the surface of the imprinting mold, a thermal oxide layer embedding into the silicon surface to an oxide depth and covering the first nanowires;
    depositing an oxide layer on the thermal oxide layer;
    directionally etching the oxide layers from a bottom of the trenches to the oxide depth;
    adding silicon to the etched trench bottoms to fill the trenches;
    polishing the mold along a horizontal plane, at least the added silicon and the oxide layers being removed along the horizontal plane to the oxide depth; and
    selectively removing a remainder of the oxide layers from in the trenches, such that a second nanowire remains between and separated from the first nanowires,
    wherein the first nanowires have a width reduced by an amount equal to twice the oxide depth.

42. The method of fabricating of claim 41, further comprising repeating the method except forming a plurality of the first nanowires, wherein repeating one or more of increases a number of the nanowires, decreases a nanowire width, decreases a pitch of the nanowires, and decreases a spacing between nanowires.

43. The method of fabricating of claim 41, wherein the added second nanowire is separated from the first nanowire by sub-trenches, a width of a sub-trench being equal to a combined thickness of the oxide layers.

44. The method of fabricating of claim 41, wherein adding silicon to the etched trench bottom comprises epitaxially growing the silicon in the trench.

45. The method of fabricating of claim 41, wherein a pitch of the nanowires after selectively removing is reduced in about half relative to a pitch of the first nanowires before thermally oxidizing.

46. A method of fabricating a nano-imprinting mold with reduced feature dimensions comprising:
    forming a plurality of spaced apart first nanowires on a surface of a substrate to create features of an imprinting mold, the first nanowires being spaced apart from one another by trenches;
    oxidizing the surface of the imprinting mold to an oxide depth;
    depositing an oxide layer on the oxidized surface;
    adding a nanowire material to the trench bottoms to fill the trenches; and
    selectively removing the oxide layer and the oxidized surface to the oxide depth from in the trenches, such that a second nanowire remains between and separated from the first nanowires by sub-trenches.

47. The method of fabricating of claim 46, wherein adding a nanowire material comprises:
    etching a bottom of the trenches to the oxide depth; and
    adding the nanowire material to the etched trench bottoms, and
    wherein selectively removing comprises removing a remainder of the oxide layer and the oxidized surface.

48. The method of fabricating of claim 46, further comprising repeating the method except forming a plurality of the first nanowires, wherein repeating incrementally decreases a core width of each nanowire.

49. The method of fabricating of claim 46, wherein a width of a sub-trench separating the first nanowire from the second nanowire is equal to a combined thickness of the oxide layer and the oxide depth.

50. The method of fabricating of claim 46, wherein adding a nanowire material to the trench bottom comprises epitaxially growing the nanowire material in the trench.

51. The method of fabricating of claim 46, wherein a pitch of the nanowires after selectively removing is reduced in about half relative to a pitch of the first nanowires before oxidizing.

52. A method of reducing feature dimensions of a nano-scale device comprising:
consuming a surface of a core substrate of the device, the device having a pattern of first nanowires on the surface formed of the core substrate, the first nanowires being spaced apart by trenches, the consumption reducing a core dimension of the first nanowires; and
forming a second nanowire on the core substrate in a trench between adjacent ones of the first nanowires, such that the device comprises a set of features that includes the first nanowires with the reduced core dimension and the second nanowire spaced from the adjacent first nanowires by sub-trenches.

53. The method of reducing of claim 52, wherein forming a second nanowire comprises:
removing the consumed surface in a bottom of the trenches to expose the core substrate;
adding a material to the exposed core substrate to fill the trenches; and
removing a remainder of the consumed surface from the trenches to create the sub-trenches on opposite sides of the added material, the added material being the second nanowire.

54. The method of reducing of claim 53, wherein forming a second nanowire further comprises:
planarizing the consumed surface along a horizontal plane to expose the core substrate before removing a remainder of the consumed surface from the trenches.

55. The method of reducing of claim 52, wherein consuming a surface comprises:
thermally oxidizing the surface, such that a thermal oxide layer both covers the surface and embeds into the core substrate to an oxide depth; and
depositing an oxide layer on the thermal oxide layer.

56. The method of reducing of claim 52, further comprising:
forming a plurality of the first nanowires in the core substrate before consuming.

57. The method of reducing of claim 52, further comprising:
repeating consuming and forming to increase a number of the nanowires in the feature set, such that one or both a pitch of the nanowires and a spacing between the nanowires is decreased.

58. The method of reducing of claim 52, wherein the reduced core dimension of the first nanowires is one or more of a nanowire core width, a nanowire core height, and a nanowire core spacing at least within the feature set.

59. The method of reducing of claim 52, wherein consuming decreases a core width of each first nanowire in proportion to a depth that the core substrate surface is consumed.

60. The method of reducing of claim 52, wherein the nano-scale device is a nano-imprinting mold with the set of features, the nano-imprinting mold being used for nano-imprint lithography, the set of features facilitating imprinting closely spaced features relative to the nano-imprinting mold before consuming and forming.

* * * * *

UNITED STATES PATENT AND TRADEMARK OFFICE
CERTIFICATE OF CORRECTION

PATENT NO. : 7,189,635 B2 Page 1 of 1
APPLICATION NO. : 10/943559
DATED : March 13, 2007
INVENTOR(S) : Shashank Sharma It is certified that error appears in the above-identified patent and that said Letters Patent is hereby corrected as shown below:

In column 14, line 44, in Claim 4, delete "mold" and insert -- substrate --, therefor.

In column 14, line 45, in Claim 4, before "material" delete "mold" and insert -- substrate --, therefor.

In column 15, line 38, in Claim 15, delete "metal" before "substrate".

In column 15, line 38, in Claim 15, insert -- a metal -- before "selected".

Signed and Sealed this

Twenty-ninth Day of September, 2009

David J. Kappos
*Director of the United States Patent and Trademark Office*